US006466153B1

(12) United States Patent
Yu

(10) Patent No.: US 6,466,153 B1
(45) Date of Patent: Oct. 15, 2002

(54) HIGHSPEED, HIGH SPURIOUS-FREE DYNAMIC RANGE PIPELINED ANALOG TO DIGITAL CONVERTER

(75) Inventor: Paul C. Yu, Coppell, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/712,719

(22) Filed: Nov. 14, 2000

Related U.S. Application Data

(60) Provisional application No. 60/171,989, filed on Dec. 23, 1999.

(51) Int. Cl.$^7$ ................................................ H03M 1/38
(52) U.S. Cl. ...................................... 341/161; 341/120
(58) Field of Search ................................ 341/161, 118, 341/120, 163; 375/252

(56) References Cited

U.S. PATENT DOCUMENTS

| | | | | |
|---|---|---|---|---|
| 5,257,026 A | * | 10/1993 | Thompson et al. | 341/118 |
| 5,404,142 A | | 4/1995 | Adams et al. | 341/144 |
| 6,218,977 B1 | * | 4/2001 | Friend et al. | 341/163 |
| 6,304,608 B1 | * | 10/2001 | Chen et al. | 375/252 |

OTHER PUBLICATIONS

Rex T. Baird, et al., "Improved ΔΣ DAC Linearity Using Data Weighted Averaging" IEEE, pp. 13–16, 1995.
Feng Chen, et al., "A High Resolution Multibit Sigma–Delta Modulator with Individual Level Averaging" IEEE Journal of Solid–State Circuits, vol. 30, No. 4, pp. 453–460, Apr. 1995.
Bosco H. Leung, et al., "Multibi Σ–Δ A/D Conveter Incorporating a Novel Class of Dynamic Element Matching Techniques" IEEE Transactions on Circuits and Systems–II: Analog and Digital Signal Processing, vol. 39, No. 1, pp. 35–51, Jan. 1992.
L. Richard Carley, "A Noise–Shaping Coder Topology for 15+ Bit Converters" IEEE Journal of Solid–State Circuits, vol. 24, No. 2, pp. 267–273, Apr. 1989.
Louis A. Williams, III, "An Audio DAC with 90dB Linearity Using MOS to Metal–Metal Charge Transfer" Texas Instruments.

* cited by examiner

Primary Examiner—Peguy JeanPierre
Assistant Examiner—Joseph J. Lauture
(74) Attorney, Agent, or Firm—J. Dennis Moore; W. James Brady, III; Frederick J. Telecky, Jr.

(57) ABSTRACT

A method for shuffling capacitors, for application in a stage of a pipelined analog-to-digital converter that samples an input voltage at each of a sequence of sample times and provides a sequence of digital outputs representing the magnitude of the sampled input voltage. The stage includes an amplifier and a plurality of capacitors which may be connected between the input voltage and an AC ground at a first time and which may be connected between the output of the amplifier and an input of the amplifier, or which may be connected between the input of the amplifier and one of a plurality of reference voltage sources at a second time. The method includes the following steps. A plurality of coded input values are provided, each such coded value corresponding to the connection of one of the capacitors between the input of the amplifier and either the at least one voltage sources or the output of the amplifier. A predetermined sequence of control codes is provided. The coded input values are shuffled in accordance with the sequence of control codes. At the second time the plurality of capacitors are connected between the input of the amplifier and the at least one of the reference voltage sources or the output of the amplifier, in accordance with the shuffled coded input values.

12 Claims, 3 Drawing Sheets

HIGHSPEED, HIGH SPURIOUS-FREE DYNAMIC RANGE PIPELINED ANALOG TO DIGITAL CONVERTER

This application claims priority under 35 U.S.C. §119(e)(1) of provisional application No. 60/171,989 filed Dec. 23, 1999.

TECHNICAL FIELD OF THE INVENTION

The present invention relates to pipelined analog to digital converter (hereinafter "ADC") systems and, more particularly, to a method and apparatus for converting element mismatch into white noise in such systems.

BACKGROUND OF THE INVENTION

A conventional multi-bit per stage, pipelined ADC 10 is shown in FIG. 1. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 1, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 is subtracted from the input signal on line 34 by summing unit 38, and the difference signal is provided on line 46 to amplifier 48, where it is amplified by a factor of $2^m$. The difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

In Σ-Δ ADCs, capacitor mismatch results in DASC errors only. This DASC error can be reduced by using a number of dynamic element matching ("DEM") techniques previously proposed for linearizing the DASC in multi-bit Σ-Δ ADCs. By using a time varying combination of capacitors to represent the given DASC output level, the element mismatch errors are averaged out over time, thereby linearizing the DASC. The same considerations apply to single stage digital-to-analog converters (DACs).

In a conventional pipelined ADC, there are several error sources. Two of these error sources are the DASC and the interstage gain error, both of which occur if the capacitors are not perfectly matched. Direct application of existing DEM techniques for linearizing DAC errors as used in Σ-Δ ADCs are not very effective since interstage gain errors can still degrade the overall linearity of the pipelined ADC. This can result in harmonic distortion that limits the SFDR.

One DEM technique that reduces both DASC and interstage gain error is to switch the feedback capacitors and DAC capacitors among one another. See [U. S. patent application Ser. No. 09/391,968] for a patent that uses this technique. This may be done randomly, which converts the element mismatch error into white noise. or, the switching may be done in accordance with some kind of predetermined sequence or pattern, in order to shape the resultant noise into which the mismatch error is converted. It is desired to have a high performance, low cost way of implementing such switching. Therefore, it is an object of the invention to provide high performance switching of the feedback capacitors and DAC capacitors in a DASC stage of a pipelined ADC. It is also an object of the present invention to provide such switching, while maintaining sufficient simplicity in the overall ADC design so as to permit a commercially viable product including such an ADC.

SUMMARY OF THE INVENTION

The present invention provides a method for shuffling capacitors, for application in a stage of a pipelined analog-to-digital converter that samples an input voltage at each of a sequence of sample times and provides a sequence of digital outputs representing the magnitude of the sampled input voltage. The stage includes an amplifier and a plurality of capacitors which may be connected between the input voltage and an AC ground at a first time and which may be connected between the output of the amplifier and an input of the amplifier, or which may be connected between the input of the amplifier and one of a plurality of reference voltage sources at a second time. The method includes the following steps. A plurality of coded input values are provided, each such coded value corresponding to the connection of one of the capacitors between the input of the amplifier and either the at least one voltage sources or the output of the amplifier. A predetermined sequence of control codes is provided. The coded input values are shuffled in accordance with the sequence of control codes. At the second time the plurality of capacitors are connected between the input of the amplifier and the at least one of the reference voltage sources or the output of the amplifier, in accordance with the shuffled coded input values.

These and other features of the invention will be apparent to those skilled in the art from the following detailed description of the invention, taken together with the accompanying drawings.

DESCRIPTION OF THE PREFERRED EMBODIMENTS OF THE PRESENT INVENTION

Figure 1:
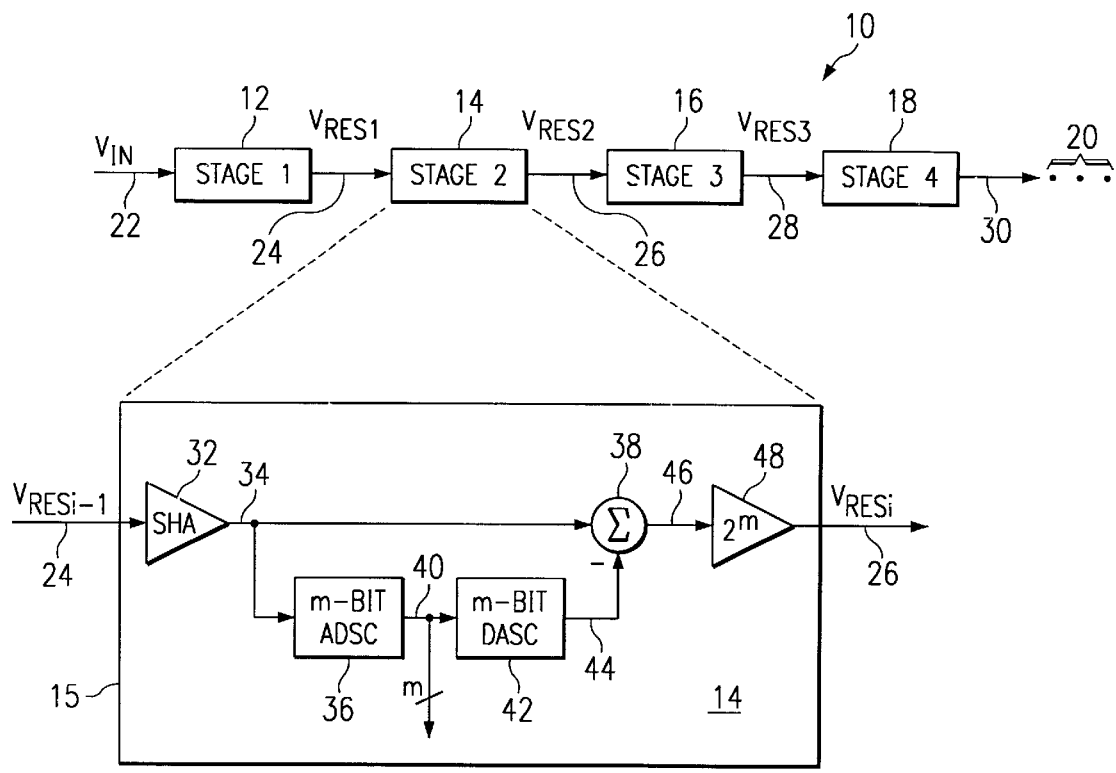
FIG. 1 is a block diagram of a prior art analog to digital converter.
Figure 2:
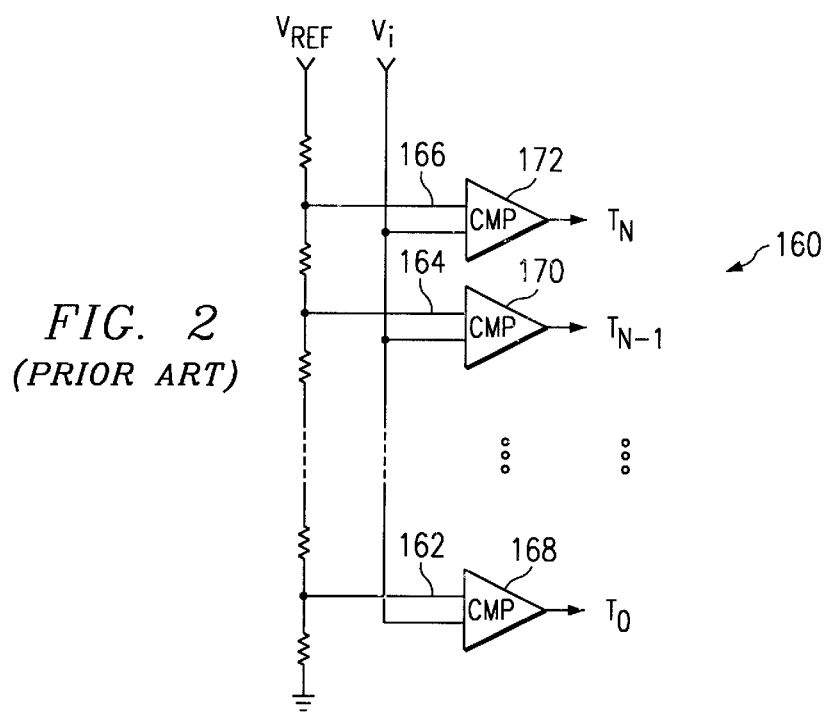
FIG. 2 is a circuit diagram of a typical prior art flash A/D.

FIG. 2 is a circuit diagram of a typical prior art flash ADC, such as used as an m-bit ADSC 36 (FIG. 1), for example. A series string of resistors 160, all having substantially the same resistance value, is connected between a positive reference voltage $V_{REF}$ and a negative reference voltage $-V_{REF}$. The common connection nodes of adjacent resistors form a number of tap points 162, . . . 164, 166, that are provided to the same number of comparators 168, . . . , 170, 172. An analog input voltage $V_i$ is provided to the other input of each of the comparators 168, . . . , 170, 172. Designating the scaled reference voltage at the tap points as $V_{REFn}$, a given comparator outputs a 1 if $V_i > V_{REFn}$, and outputs a 0 if $V_i < V_{REFn}$. These outputs of the comparators 168, . . . , 170, 172, are designated $T_0$, . . . $T_{N-1}$, $T_N$, respectively, and together form a code commonly referred to as a thermometer code (TC). The TC is a digital representation of the analog input voltage $V_i$. The TC is converted to a binary code, which is the m-bit sub-word discussed above in connection with in FIG. 1.

Figure 3:
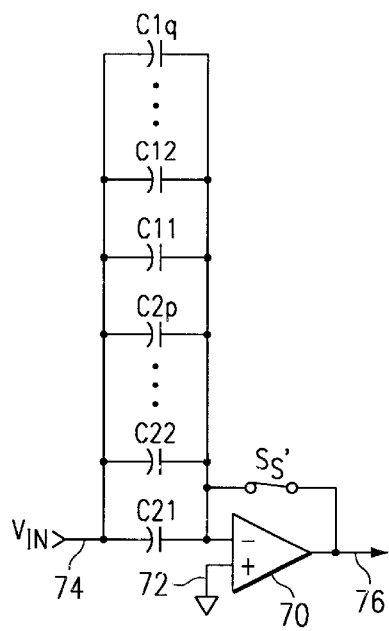
FIG. 3 is a circuit diagram of a pertinent portion of a sample and hold amplifier in a first phase configuration.

FIG. 3 is a circuit diagram of pertinent portions of a pipelined stage, such as stage 15 (FIG. 1), as configured in a first phase, that of sampling. In the circuit of FIG. 3 is a differential amplifier 70, having a non-inverting input connected to ground by way of a line 72. An input line 74 provides an analog input voltage $V_i$ to two sets of capacitors, a first set C11, C12, . . . , C1q, and a second set of capacitors C21, C22, . . . , C2p, all of which capacitors are connected in parallel between the input line 74 and an inverting input of amplifier 70. The numbers p and q are, in general, selectable, depending upon the performance desired versus the chip area to be occupied by the sample and hold amplifier. The inverting input of amplifier 70 is also connected by way of a switch $S_S$ to the output of amplifier 70, line 76. Thus, switch $S_S$ provides a virtual ground connection for capacitors C11, C12, . . . , C1q, and capacitors C21, C22, . . . , C2p, so that they can charge up during the sample phase, and capture the sampled voltage $V_i$ at the sample time. It is necessary that the capacitors be connected to a virtual ground or AC ground, collectively referred to herein simply as AC ground, for this purpose. Switch $S_S$ is opened at the end of the sample phase to capture that charge for use in the next, amplifying phase.

Figure 4:
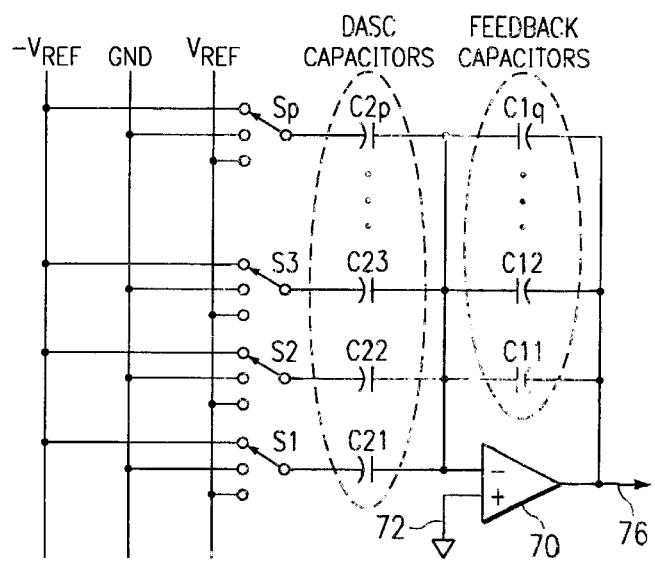
FIG. 4 is a circuit diagram of a pertinent portion of a sample and hold amplifier in a second phase configuration.

FIG. 4 is a circuit diagram of the circuit of FIG. 3, as configured in a second phase, that of amplification. As can be seen, in FIG. 4 the capacitors in the first group, C11, C12, . . . C1q, are now connected all in parallel as feedback capacitors between the output line 76 and the inverting input of amplifier 70. The capacitors in the second group, C21, C22, . . . C2p, are now all connected in parallel together as DAC capacitors between the negative input of amplifier 70 and to a respective one of a corresponding number of switches S1, S2, . . . Sp. Each of these switches, S1, S2, . . . Sp, allows the port of its respective DAC capacitor to be connected to $V_{REF}$, $V_{CM}$, or $-V_{REF}$, depending upon the position of the switch. Note that in some variations $V_{CM}$ is not used and, in addition, more than three reference voltages may be used, depending on the design considerations, which is also true for the circuit shown in FIG. 5, discussed below, which is a special case of the circuit shown in FIG. 3. The positions of the switches are determined by the value of the thermometer code TC, discussed above, and function to reduce the resulting amplified voltage output of amplifier 70 by an amount corresponding to the value of the m-bit sub-word discussed above in connection with in FIG. 1. This ensures that the output of amplifier 70 is the residue of the stage, for provision to the next stage in the pipeline.

Now, in switching the feedback capacitors and DAC capacitors among one another, for example randomly, the connections of the DAC capacitors to $V_{REF}$, $V_{CM}$, and $-V_{REF}$ are correspondingly switched, for example randomly such as with a pseudo-random code generated by a digital circuit. As mentioned above, the numbers p and q are selectable. Out of the p number of unit capacitors, depending on the digital decisions, a selectable number i of them may be connected to $V_{REF}$, j of them to $-V_{REF}$, and k of them to $V_{CM}$. Over time, however, part or all of the q feedback capacitors may be used as the DAC capacitor, and vice versa.

Preferred embodiments of the shuffling network of the present invention will be now described in the context of a 2.8 b/stage pipelined architecture implemented in a 14 b 70MS/s ADC, such as the TI® THS1470 manufactured by Texas Instruments Incorporated. In this case, the total number of capacitors used is four, as shown in the conventional implementation in FIGS. 5 and 6. The four capacitors are labeled C1, C2, C3 and C4, in FIG. 5. Switches S1, S2 and S3 are provided, as shown in FIG. 6, for switching the DAC capacitors, labeled Ca, Cb and Cc, to $V_{REF}$, $V_{CM}$ or $-V_{REF}$, depending on the value of the TC, as discussed above. The output of the amplifier 70 is $V_{out}$, the residue. The switching scheme utilized in the preferred embodiment is random, using pseudo-random codes. However, other switching schemes may be used, and arrangements using the principles of the present invention in such cases are considered within the scope of the present invention, as set forth in the claims appended hereto.

Note that the circuits shown in FIGS. 3, 4, 5 and 6 are single ended, for ease of explanation. The principles implemented in such circuits are essentially the same for circuits that are fully differential, and the considerations involved in implementing the present invention are essentially the same as those discussed herein, with the considerations applying to both differential paths, rather than to only the one path in a single-ended circuit.

Figure 7:
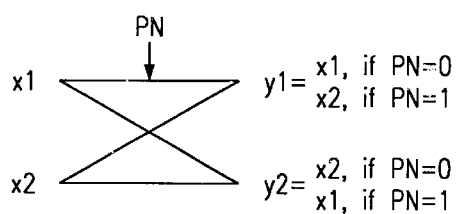
FIG. 7 is a diagram of a swapping cell used in preferred embodiments of the present invention.

A parallel shuffling network (PSN) of a first preferred embodiment is made of a novel arrangement of swapper or swapping cells. A swapper cell is shown in FIG. 7. Based on the control of a one-bit pseudo-random code, PN, the 2 bits output by the swapper cell are either a swapped or non-swapped version of the 2 bits input to the cell. In this case, if PN=0 the output is non-swapped, while if PN=1 the output is swapped. Designating the two bits input to the cell as x1 and x2, then the non-swapped outputs y1 and y2 are equal to x1 and x2, while the swapped output is equal to x2 and x1, as shown in the figure. Swapper cells are well known.

Figure 8:
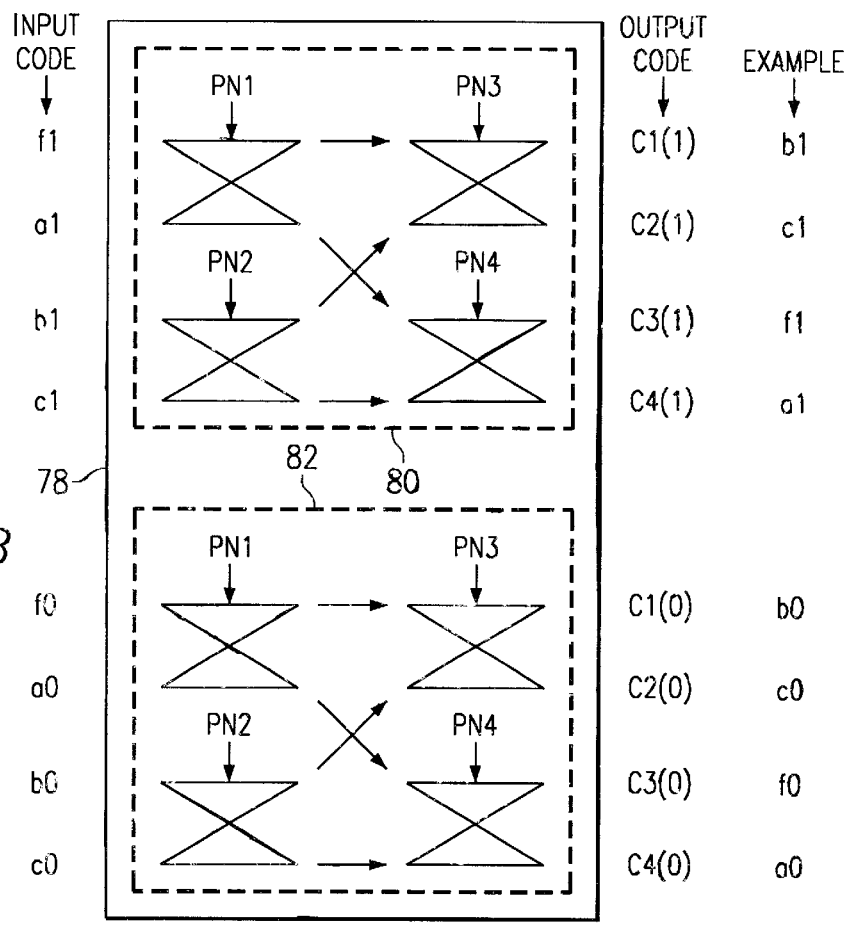
FIG. 8 is a diagram of a parallel shuffling network (PSN) of a first preferred embodiment of the present invention.

FIG. 8 shows a PSN 78 of a first preferred embodiment of the present invention, in which a novel parallel configuration is utilized. The PSN 78 consists of two identical networks 80, 82, shown in parallel in the figure. Each of the two networks 80, 82, is a 2×2 swapper unit that includes four of the swapper cells described above in connection with FIG. 7. The control signals PN1–4 are applied to the four swapper cells in each of the parallel networks 80, 82, as shown.

The inputs to the shuffling network are two-bit codes a1a0, b1b0, c1c0, and f1f0. A code of 11 represents the value −1, a code of 00 represents the value 0, and a code of 01 represents the value 1, all used in connection with the designation of a capacitor to be a DAC capacitor. A code of 10 is used to designate a capacitor as a feedback capacitor. Now, it will be recalled that the feedback capacitors are shuffled along with the DAC capacitors, such that the bottom plate of each capacitor can have one of four connections: $V_{REF}$, $V_{CM}$, $-V_{REF}$, and $V_{out}$ of the amplifier 70 (FIG. 6). The three codes a1a0, b1b0, and c1c0, which are derived from the thermometer output TC of the flash ADC used as the ADSC, determine the three possible reference levels $V_{REF}$, $V_{CM}$, and $-V_{REF}$, to which each of the three DAC capacitors are to be connected. A code value of 1 indicates connection to $V_{REF}$, a code value of 0 indicates connection to $V_{CM}$, and a code value of −1 indicates connection to $-V_{REF}$. As mentioned above, a code of 10 indicates use as a feedback capacitor, i.e., connection to $V_{out}$. The feedback capacitor Cf (FIG. 6) is associated with the two-bit code f1f0. The remaining capacitors Ca, Cb and Cc, are associated with codes a1a0, b1b0 and c1c0, respectively.

The two bit input codes are split into MSB and LSB and are input to the top network 80 and the bottom network 82, as shown in FIG. 8. The MSB and LSB are shuffled in parallel based on the control signals PN1–4 which are codes generated from a pseudo-random number generator (not shown), which may be of any conventional type. Performing the shuffling in parallel ensures the high-speed required by the performance demands found today in many ADC applications, for example 70MS/s. At the output of the PSN 78, the position where the input code appears indicates whether the capacitor associated with the code is to be connected to $V_{REF}$, $V_{CM}$, $-V_{REF}$, or $V_{out}$ of the op-amp, in accordance with the code scheme described hereinabove. Thus, the top position is associated with C1, the next position down with C2, then C3, with the bottom position being associated with C4.

The control signals PN1–4 may all be different pseudo-random code sequences, or the same sequences but time shifted with respect to one another. The codes for some of the control signals PN1–4 may even be the same pseudo-random codes. The use of all different pseudo-random codes, however, assures that the harmonic components from mismatch errors are converted most completely to white noise.

Also, it will be appreciated that the number of codes for a given PSN will depend on the size and configuration of the particular PSN.

An example is shown at the right side of FIG. 8. As a result of particular control signals PN1–4 which are applied in FIG. 8, f1f0 appears at the third position from the top.

Figure 5:
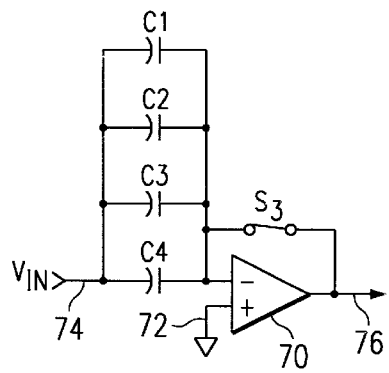
FIG. 5 is a circuit diagram of a sample and hold amplifier having four capacitors, in a first configuration.
Figure 6:
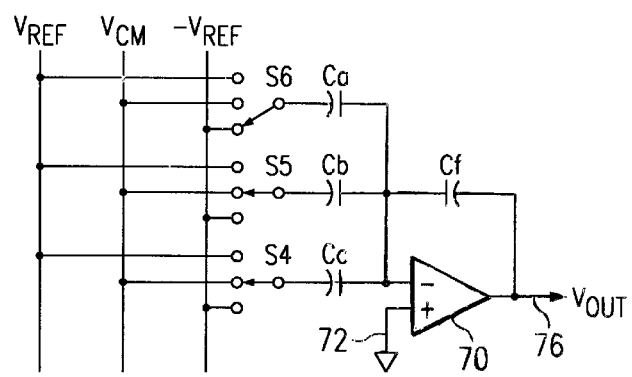
FIG. 6 is a circuit diagram of a sample and hold amplifier having four capacitors, in a second configuration.

Accordingly, C3 is selected as the feedback capacitor Cf (FIGS. 5, 6). At the same time, C1, C2, and C4 are selected as the DAC capacitors Cb, Cc and Ca, since the codes b1b0, c1c0 and a1a0 appear at the first, second and fourth positions from the top at the output of PSN 78.

Applying the code scheme described above, assume that the input codes a1a0, b1b0, and c1c0 are assigned the values −1, −1, and 0, respectively. Based on the example shown in FIG. 8, this means that capacitor C1 which is assigned code b1b0 will be connected to −VREF, capacitor C2 which is assigned c1c0 will be connected to VCM and capacitor C4 which is assigned a1a0 will be connected to −VREF.

Thus, three of the four possible states represented by the two-bit code is used to determine the three possible reference levels VREF, VCM, and −VREF, to which the three DAC capacitors are to be connected. The fourth state of the two-bit code, f1f0, is used to determine if the capacitor is to be a feedback capacitors this manner, the feedback capacitor and the DAC capacitors are shuffled simultaneously in high speed.

Now, while the specific embodiment described hereinabove is in the context of a four capacitor DASC, the inventive concepts can be applied more generally, to any number of p, q, capacitors (FIGS. 3, 4). Easiest is application to a pipelined stage having a binary number of capacitors. In such applications the PSN 78 is simply expanded in width and/or height as necessary to provide the appropriate shuffling. In applications to DASCs having a non-binary number of capacitors, a PSN may be provided as described above, and an additional layer of coding provided to the output of the PSN to provide the appropriate shuffling.

In high speed ADC operation, the time allocated for the comparator to perform its function in each cycle is very short. When the analog input to the comparator is very close to its trip point, the comparator sees a very small difference voltage. As a result, the comparator may or may not output an appropriate "1" or "0". This ambiguous state is known as the meta-stable state. In implementing the preferred embodiment of the present invention, this can lead to significant problems if the coding is not done in accordance with the teachings herein, as the following example illustrates.

The straightforward coding for the DAC reference level is 01, 00, and 11 for connection to $V_{REF}$, $V_{CM}$, and $-V_{REF}$. This leaves 10 as the code f1f0 for the feedback capacitor.

Table 1 shows the coding:

TABLE 1

| d | T5 T4 T3 T2 T1 T0 | C2 C3 C4 | a1a0 b1b0 c1c0 | f1f0 |
|---|---|---|---|---|
| 0 | 0 0 0 0 0 0 | −1 −1 −1 | 11 11 11 | 10 |
| 1 | 0 0 0 0 0 1 | −1 −1 0 | 11 11 00 | 10 |
| 2 | 0 0 0 0 1 1 | −1 0 0 | 11 00 00 | 10 |
| 3 | 0 0 0 1 1 1 | 0 0 0 | 00 00 00 | 10 |
| 4 | 0 0 1 1 1 1 | 1 0 0 | 01 00 00 | 10 |
| 5 | 0 1 1 1 1 1 | 1 1 0 | 01 01 00 | 10 |
| 6 | 1 1 1 1 1 1 | 1 1 1 | 01 01 01 | 10 |

From Table 1, it can be seen that:

$a1=\overline{T2}$, $a0=\overline{\overline{T3}\cdot T2}$ $b1=\overline{T1}$, $b0=\overline{\overline{T4}\cdot T1}$ $c1=\overline{T0}$, $c0=\overline{\overline{T5}\cdot T0}$    Eqs. 1

In the case of meta-stability of one comparator, e.g. T0, then c1c0 can change from 11 to 10 if the meta-stable T0 were interpreted as 0 by c1 and as 1 by c0. Then c1c0 would change from 11 to 10. This would lead to the undesirable result that two capacitors are selected as the feedback capacitors.

To remedy this situation, a simple change in coding is made. The new coding uses 10 to represent −1, and 11 to represent f1f0. As can be seen from Table 2, the coding is now bitwise thermometer coded:

TABLE 2

| d | T5 T4 T3 T2 T1 T0 | C2 C3 C4 | a1a0 b1b0 c1c0 | f1f0 |
|---|---|---|---|---|
| 0 | 0 0 0 0 0 0 | −1 −1 −1 | 10 10 10 | 11 |
| 1 | 0 0 0 0 0 1 | −1 −1 0 | 10 10 00 | 11 |
| 2 | 0 0 0 0 1 1 | −1 0 0 | 10 00 00 | 11 |
| 3 | 0 0 0 1 1 1 | 0 0 0 | 00 00 00 | 11 |
| 4 | 0 0 1 1 1 1 | 1 0 0 | 01 00 00 | 11 |
| 5 | 0 1 1 1 1 1 | 1 1 0 | 01 01 00 | 11 |
| 6 | 1 1 1 1 1 1 | 1 1 1 | 01 01 01 | 11 | i.e., $$a1=\overline{T2}, a0=T3$$

$$b1=\overline{T1}, b0=T4$$

$$c1=\overline{T0}, c0=T5 \qquad \text{Eqs. 2}$$

Notice that with the bit-wise thermometer code, a single comparator meta-stability only changes to the next state (e.g. from d=0 to d=1). With digital error correction, this new coding scheme is essentially insensitive to any comparator meta-stability problem.

Figure 9:
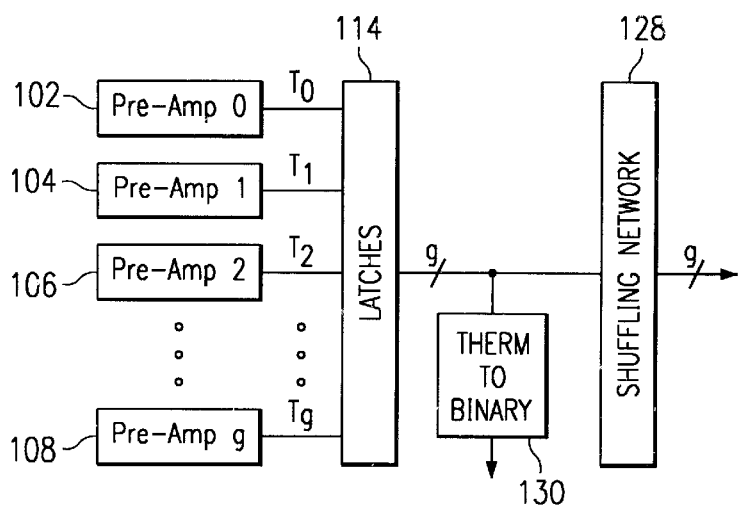
FIG. 9 is a block diagram showing pertinent portions of a preferred embodiment of the present invention, including a shuffling network 128 integrated therewith.

FIG. 9 is a block diagram showing pertinent portions of a preferred embodiment of the present invention, including a shuffling network 128 integrated therewith. A set of N pre-amplifiers (pre-amps) 102, 104, 106, . . . 108, generates a corresponding set of outputs $PR_0, PR_1, PR_2, \ldots, PR_N$, which are provided to a corresponding set of latches 114, in conventional manner. Together, a given pre-amp and the particular latch receiving the output of that pre-amp operate as a comparator, such as comparator 168, 170 etc., in FIG. 2. The N outputs of the set of latches 114 represent the digitized thermometer codes $T_0, T_1, T_2, \ldots T_N$, and are provided to a thermometer code to binary code converter 130. The output of converter 130 is the m-bit sub-word that is provided, e.g., on line 40 in FIG. 1, as the output of the ADC stage. The outputs of the set of latches 114 are also provided to a PSN 128, which is constructed according to the principles discussed above in connection with FIG. 8.

Although the present invention and its advantages have been described in detail it should be understood that various changes, substitutions and alterations can be made herein without departing from the spirit and scope of the invention as defined by the appended claims. For example, while all of the capacitors are described above as being connected to the input voltage during sampling, some capacitors may be connected during sampling to a reference voltage, for example, and still be part of the shuffling. All such variations and embodiments are considered within the scope of the invention as set forth in the appended claims.

What is claimed is:

1. In a stage of a pipelined analog-to-digital converter that samples an input voltage at each of a sequence of sample times and provides a sequence of digital outputs representing a magnitude of said sampled input voltage, said stage including an amplifier and said stage including a plurality of capacitors which are connected between said input voltage and an AC ground at a first time and which are connected between the output of said amplifier and an input of said amplifier or, alternatively, between said input of said amplifier and one of a plurality of reference voltage sources, at a second time, a method for shuffling said capacitors comprising the steps of:

deriving a plurality of coded input values from a digital representation of said input voltage, each such coded value corresponding to the connection of one of said capacitors between said input of said amplifier and either said at least one voltage sources or said output of said amplifier;

providing a predetermined sequence of control codes;

shuffling said coded input values in accordance with said sequence of control codes; and at said second time connecting said plurality of capacitors between said input of said amplifier and said at least one of said reference voltage sources or said output of said amplifier, in accordance with said shuffled coded input values.

2. A method according to claim 1, wherein said step of providing a predetermined sequence of control codes is performed by providing a sequence of pseudo-random codes.

3. A method according to claim 1, wherein said step of shuffling said coded input values is performed by providing two shuffling networks operable in parallel to shuffle said bits of said coded input values in parallel.

4. A method according to claim 1, wherein said plurality of reference voltage sources comprise three reference voltage sources, and wherein:

said step of deriving is performed by deriving coded values comprising two bits corresponding to the connection of one of said capacitors and one of said three voltage reference sources; and said step of connecting is performed by connecting said plurality of capacitors between said input of said amplifier and one of said three reference voltage sources or said output of said amplifier, in accordance with said shuffled coded input values.

5. In a stage of an analog-to-digital converter that samples an input voltage at each of a sequence of sample periods and provides, in a sequence of holding periods that alternate with said sample periods, a sequence of digital outputs representing a magnitude of said sampled input voltage during said sequence of sample periods, said stage including an amplifier and said stage including a plurality of capacitors which are connected between said input voltage and AC ground during said sample periods and which are connected between the output of said amplifier and an input of said amplifier or, alternatively, between said input of said amplifier and one of a plurality of voltage references, during said holding periods, a method for shuffling said capacitors comprising the steps of:

deriving a plurality of coded input values from a digital representation of said sampled input voltage, each of said coded input values corresponding to the connection of one of said capacitors between said input of said amplifier and one of said plurality of voltage references or said output of said amplifier;

providing a sequence of pseudorandom codes;

for each of said holding periods, shuffling said coded input values in accordance with said sequence of pseudorandom codes; and during each said of holding periods connecting said plurality of capacitors between said input of said amplifier and said plurality of voltage references or said output of said amplifier, in accordance with said shuffled coded input values.

6. A method according to claim 5, wherein said step of providing a plurality of coded input values is performed by
providing a thermometer code from a set of pre-amplifiers; and
providing four coded input values according to a predetermined relationship between a thermometer code and said coded input values.

7. A method according to claim 6, wherein said thermometer codes have six bits, T0 through T5, said four coded input values are a1a0, b1b0, c1c0 and f1f0, the first three of said coded input values corresponding to a connection of a capacitor between said input of said amplifier and one of said three reference voltages, and the last of said coded input values corresponding to a connection of a capacitor between said input of said amplifier and said output of said amplifier, wherein F1f0 is always 11, and wherein for the first three of said coded input values 01 corresponds to a connection to a positive reference voltage, 10 corresponds to a connection to a negative reference voltage and 00 corresponds to a connection to a voltage intermediate said positive reference voltage and said negative reference voltage; and said predetermined relationship comprises:

| T5 T4 T3 T2 T1 T0 | a1a0 b1b0 c1c0 | f1f0 |
|---|---|---|
| 0 0 0 0 0 0 | 10 10 10 | 11 |
| 0 0 0 0 0 1 | 10 10 00 | 11 |
| 0 0 0 0 1 1 | 10 00 00 | 11 |
| 0 0 0 1 1 1 | 00 00 00 | 11 |
| 0 0 1 1 1 1 | 01 00 00 | 11 |
| 0 1 1 1 1 1 | 01 01 00 | 11 |
| 1 1 1 1 1 1 | 01 01 01 | 11 |

8. A method according to claim 7, wherein said step of shuffling is performed by providing said coded input values at positions at an input side of a shuffling network, and said coded input values are shuffled to locations at an output side of said shuffling network depending on said pseudorandom codes; and
wherein after said step of shuffling said capacitors are connected in accordance with said shuffled coded input values, depending on said locations at said output side of said shuffling network.

9. A method according to claim 5, wherein said plurality of reference voltage sources comprise three reference voltage sources, and wherein:
said step of deriving is performed by deriving coded values comprising two bits corresponding to the connection of one of said capacitors and one of said three voltage reference sources; and
said step of connecting is performed by connecting said plurality of capacitors between said input of said amplifier and one of said three reference voltage sources or said output of said amplifier, in accordance with said shuffled coded input values.

10. A pipelined analog-to-digital converter having a plurality of stages, each such stage including:
a sample-and-hold amplifier (SHA) that samples an input voltage at each of a sequence of sample periods and provides, in a sequence of holding periods that alternate with said sample periods, a sequence of digital outputs representing a magnitude of said sampled input voltage during said sequence of sample periods, said SHA including an amplifier and said SHA including a plurality of capacitors which are connected between said input voltage and AC ground during said sample periods and are be connected between the output of said amplifier and an input of said amplifier or, alternatively, between said input of said amplifier and at least one reference voltage source during said holding periods;
means for deriving a plurality of coded input values from a digital representation of said sampled input voltage, each such coded input value corresponding to the connection of one of said capacitors between said input of said amplifier and either said at least one reference voltage source or said output of said amplifier;
a pseudorandom code generator providing a sequence of pseudorandom codes;
means for shuffling said coded input values, for each of said holding periods, in accordance with said sequence of pseudorandom codes; and
means for connecting said plurality of capacitors, during each said of holding periods, between said input of said amplifier and either said at least one reference voltage source or said output of said amplifier, in accordance with said shuffled coded input values.

11. A method according to claim 10, wherein said plurality of reference voltage sources comprise three reference voltage sources, and wherein:
said step of deriving is performed by deriving coded values comprising two bits corresponding to the connection of one of said capacitors and one of said three voltage reference sources; and
said step of connecting is performed by connecting said plurality of capacitors between said input of said amplifier and one of said three reference voltage sources or said output of said amplifier, in accordance with said shuffled coded input values.

12. A method according to claim 11, wherein said plurality of capacitors comprise four capacitors.

* * * * *